(12) United States Patent
Biran et al.

(10) Patent No.: US 6,519,145 B1
(45) Date of Patent: Feb. 11, 2003

(54) ETSI/NEBS HOUSING STRUCTURE

(75) Inventors: Gil Biran, Raananna (IL); Yoram Henik, Shoham (IL)

(73) Assignee: Axerra Networks, Ltd., Tel-Aviv (IL)

( * ) Notice: Subject to any disclaimer, the term of this patent is extended or adjusted under 35 U.S.C. 154(b) by 141 days.

(21) Appl. No.: 09/709,220

(22) Filed: Nov. 9, 2000

(51) Int. Cl.[7] .............................................. G06F 1/16
(52) U.S. Cl. ........................ 361/687; 361/803; 439/61; 710/103
(58) Field of Search ................................ 361/687, 785, 361/788, 791, 796, 803; 439/61, 62; 211/26; 379/326; 174/59; 710/103

(56) References Cited

U.S. PATENT DOCUMENTS

| | | | |
|---|---|---|---|
| 5,323,916 A | 6/1994 | Salmon | 211/26 |
| 5,488,541 A | 1/1996 | Mistry et al. | 361/788 |
| 5,926,540 A | 7/1999 | Lindemulder | 379/326 |
| 5,934,485 A | 8/1999 | Harris et al. | 211/26 |
| 5,939,673 A | 8/1999 | Rentmore | 174/59 |
| 5,975,315 A | 11/1999 | Jordan | 211/26 |
| 6,006,298 A | 12/1999 | Satoh | 710/103 |
| 6,006,925 A | 12/1999 | Sevier | 211/26 |
| 6,272,573 B1 * | 8/2001 | Coale et al. | 710/100 |
| 6,313,985 B1 * | 11/2001 | Chen et al. | 361/685 |
| 6,318,679 B1 * | 11/2001 | Yang et al. | 248/27.1 |

OTHER PUBLICATIONS

Nortel Networks Universal Edge IMAS.
Business Wire, The Global Leader in News Distribution, 1997–2000, Northern Light Technology, Inc.
RadiSys. CP8o NEBS and ETSI CompactPCI* Platform.

* cited by examiner

*Primary Examiner*—Darren Schuberg
*Assistant Examiner*—Hung Van Duong
(74) *Attorney, Agent, or Firm*—Katten, Muchin, Zavis, Roseman (57) ABSTRACT

Alternative structures and backplanes are designed so as to provide for telecom/datacom equipment conforming to either the ETSI standard or NEBS standard with minimum engineering efforts and with minimum changes in the basic parts of the products. ETSI chassis has an upper enclosure region for housing interface modules of the system and a lower enclosure region for housing system modules of the system. When assembled, a backplane is disposed along a common back wall of both enclosures. A portion of the backplane extends into the upper enclosure region from the lower enclosure region and includes connectors for receiving connectors of the interface modules. The portion of the backplane located in the lower enclosure region includes connectors for receiving connectors of the system modules. The NEBS chassis has front and rear enclosure regions for housing system modules and interface modules, respectively, and slots located on the front and rear walls for receiving system modules and interface modules into their respective housing regions. When assembled, a NEBS backplane is disposed along a plane dividing the front and rear regions. The backplane has a surface facing the front enclosure region including connectors for receiving connectors of the system modules and a surface facing the rear enclosure region for receiving connectors of the interface modules. The modules used in the equipment are the same for both structures and backplanes.

21 Claims, 11 Drawing Sheets

ETSI/NEBS HOUSING STRUCTURE

BACKGROUND OF THE INVENTION

1. Field of Invention

The present invention relates generally to the field of telecom/datacom equipment. More specifically, the present invention is related to telecom/datacom equipment conforming to different mechanical standards, which utilizes common basic components of the equipment.

2. Background

A telecommunications or data communications vendor who sells equipment to service providers must provide equipment which meets a number of requirements. Some of these requirements are dictated by industry standards, while others are common "known" criteria.

Particularly, vendors that sell equipment to service providers in a global market find themselves facing conflicting requirements from different service providers over the world. It is the goal of the vendor engineering team to support all requirements with minimum engineering efforts and with minimum changes in the basic parts of the products, such as the system and I/O modules. Changes cause multiple part numbers, increased support, increased risk for mistakes etc.

The mechanical design of the telecom/datacom equipment is one of the fields where service providers are mostly involved by standardization and special requirement. The equipment has to fit into the racks of the service providers, has to be accessed and serviced easily, has to conform to the cooling mechanism the service provider requires, in addition to meeting other requirements.

There are primarily two standards common in the world that have dominion over the mechanical design of telecom/datacom equipment. One standard is the ETSI (European Telecommunications Standards Institute) standard that is common in Europe, while the other is the NEBS (Network Equipment Building Systems) standard that is typically requested in the U.S.A.

The following provides a general overview of the basic and most common requirements requested by the ETSI standards and the European service providers:

Equipment should not exceed 300 mm deep (to fit in a 300 mm rack).

Access to equipment is only from the front. The 300 mm ETSI rack has no rear access.

Therefore, cables/connections cannot be connected to the rear of the equipment.

To improve the serviceability and reliability of the system, replacing a system module does not involve disconnecting or removing cables.

Airflow is from bottom to top. Whenever possible, convection cooling is preferred.

On the other hand, the following provides a general overview of the basic and most common requirements requested by the NEBS standards and American service providers:

All connections/cables should be connected on the rear side of the rack (and therefore on the rear side of the equipment).

System modules should be plugged and accessed from the front side of the rack.

Indicators should be viewed from the front.

To improve the serviceability and reliability of the system, replacing a system module does not involve disconnecting or removing cables.

Airflow should be from the front to the backside.

As illustrated by the above points, generally, the only common requirement of both standards is the improvement to serviceability (and reliability) by separating the input/output connections (cables) from the system modules. This means that when a system module fails, the technician will need only to replace the module and will not need to disconnect cables. However, there is a main difference between the requirements as to the side in which the system is "serviced".

The ETSI standard requires that all cables and connectors and also the system cards will be plugged from the front—so it is said that the "service" to the equipment can be done only from the front.

For the NEBS requirement, the cable connections should be on the rear, while indicators and system modules are accessed from the front. This means that the "service" to the equipment is from both sides of the rack.

For a fuller understanding behind the requirements, it is important to know how a service provider telecom hall is built. The equipment racks are arranged in rows, each row of racks has aisles on both sides. For NEBS racks, there is a "front" aisle and a "back" aisle. On the front aisle are all the equipment indicators and system modules. On the back aisle all the cables are connected. In addition, the hall room air-condition is coming in to the front aisle and exhausted on the back aisle.

For ETSI racks, however, each row of racks is built of back to back racks, so actually both aisles "see" the front of the equipment with access both to cables, indicators and cards.

Generally, there is the need for alternative equipment that, while differing in, mechanical design due to the standard supported, are designed in such a way that the basic components of the equipment, e.g. system modules, interface modules, power supply modules, fan modules, etc., do not need to be designed differently for the two designs, i.e. the basic components are able to be designed to be useable in either.

SUMMARY OF THE INVENTION

ETSI/NEBS housing structures and backplanes are provided to support their respective standards with minimum engineering efforts for their design and minimum changes in the basic components of telecom/datacom equipment.

The ETSI compliant structure, generally, has a lower enclosure region for housing system modules of the telecom/datacom equipment and an upper enclosure region for housing interface modules of the telecom/datacom equipment. Slots are located on each of the front walls defining each enclosure region for receiving the system and interface modules of the system. When the ETSI compliant structure is assembled with the ETSI backplane, the backplane is disposed in the interior of the structure along a common back wall. A lower portion of the backplane, including connectors for receiving connectors of the system modules, is substantially contained in the lower enclosure region and an upper portion, including connectors for receiving connectors of the interface modules, extends into and is substantially contained within the upper enclosure region.

A fan enclosure region is located beneath the lower enclosure region for housing a fan module. A fan slot is located on the front wall of the structure for receiving the fan module and a portion of the backplane, including a fan connector for receiving connectors of the fan module, extends into and is substantially enclosed within fan enclosure region. Preferably, power supply slots are located adjacent to and coextensive with system module slots on the front wall of lower enclosure region for receiving power supply modules. The power supply modules are enclosed within the lower enclosure region and connectors of the power supply modules connect to connectors located on backplane adjacent to and coextensive with the system module connectors on the backplane.

The NEBS compliant structure, generally, has a front enclosure region for housing system modules of the telecom/datacom equipment and a rear enclosure region for housing interface modules of the telecom/datacom equipment. Slots are located on the front wall defining the front enclosure region for receiving the system modules of the system and on the rear wall defining the rear enclosure region for receiving interface modules of the system. When the NEBS compliant structure is assembled with the NEBS backplane, the backplane is disposed in the interior of the structure along a plane dividing the front enclosure region from the rear enclosure region. Since the backplane is located on the mid part of the structure, it is commonly known in the art as a "mid-plane". In similar structures the term "mid-plane" is sometimes used instead of "backplane." However, throughout the rest of this disclosure, rather than mid-plane for the NEBS chassis, backplane will be used. A first surface of the backplane, including connectors for receiving connectors of the system modules, faces the front enclosure region and a second surface, opposite said first surface, including connectors for receiving connectors of the interface modules faces the rear enclosure region.

A fan enclosure region is located beneath the front enclosure region for housing a fan module and an air exhaust tunnel is located above the front and rear enclosure regions. A fan slot is located on the front wall of the structure for receiving the fan module and a portion of the backplane, including a fan connector on the first surface for receiving connectors of the fan module, extends into and is substantially enclosed within fan enclosure region. Preferably, power supply slots are located adjacent to and coextensive with system module slots on the front wall of front enclosure region for receiving power supply modules. The power supply modules are enclosed within the front enclosure region and connectors of the power supply modules connect to connectors located on backplane adjacent to and coextensive with the system module connectors on the backplane.

DESCRIPTION OF THE PREFERRED EMBODIMENTS

While this invention is illustrated and described in a preferred embodiment, the device may be produced in many different configurations, forms and materials. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

In the present invention, the subsystem components are divided into two parts. The first is main/system modules that include all the internal functions of the subsystem. Examples of internal functions are: a) a central processing unit (CPU) with all its memory (volatile and non-volatile) and peripherals. b) a TDM framer and cross connect function. c) A communication controller with switching and routing functions. d) a TDM or Packet multiplexor. The second is interface modules (IM) that include all the Input/Output interfaces of the subsystem. Examples of I/O interfaces are: a) T1/E1 physical interfaces (magnetics) b) T3/E3 physical interface. c) RS232, RS530, RS422 and 10/100 bT Ethernet interface. d) Fiber optic interfaces of various kinds.

Dividing the modules as described above facilitates the cross standards use of components and provides for an efficient mechanical design of the alternative equipment. This division allows the IM modules to be located in a different side and orientation in the chassis, enabling support for the different requirements from the NEBS and ETSI standards. It also allows support for the basic requirement of all service providers to enable replacing modules, without disconnecting cables. In addition, the same main module can support many types of interfaces and connectors. This is accomplished by changing the interface module (IM).

Figure 1A:
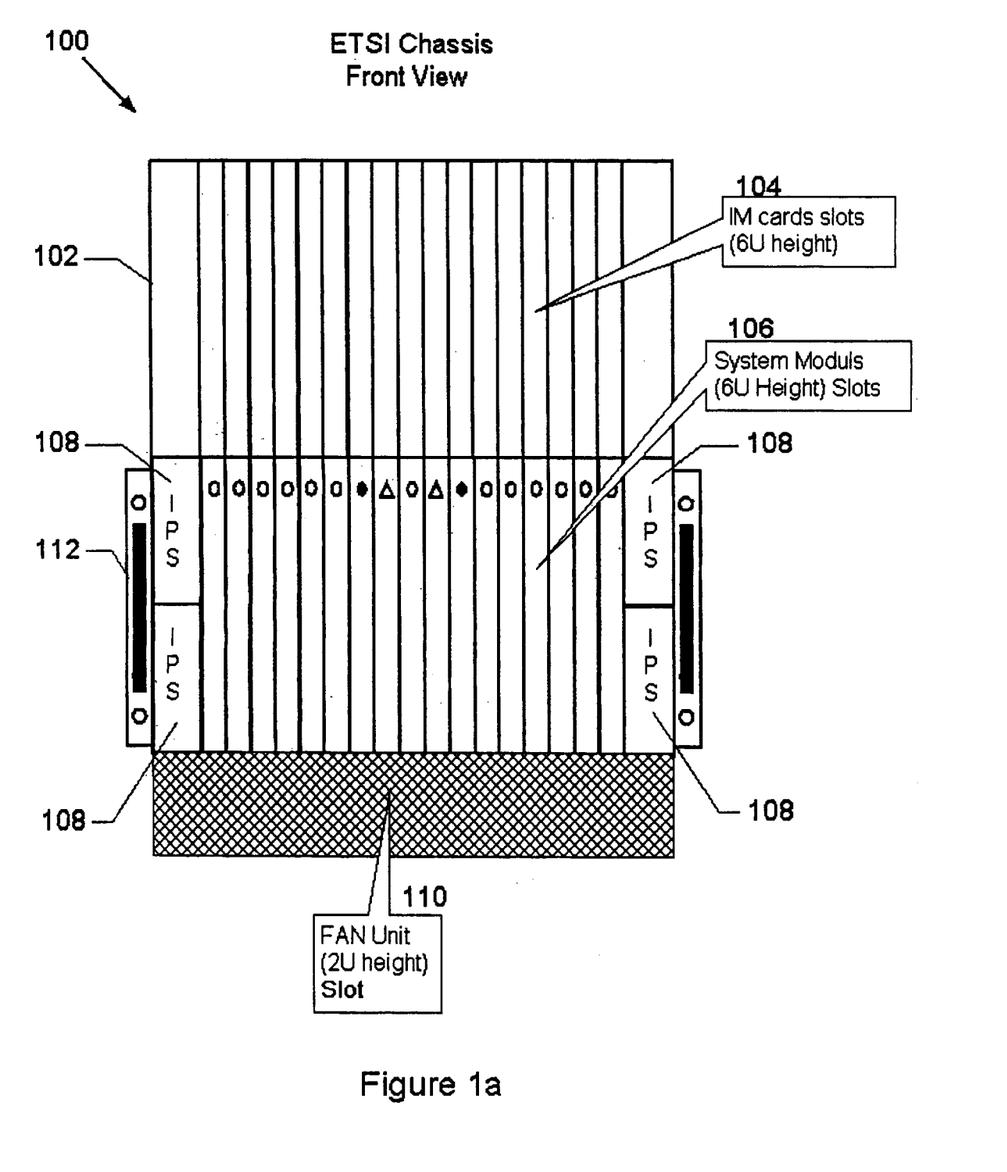
FIGS. 1a–1c, collectively, illustrate the ETSI chassis of the present invention.

FIG. 1a shows a front plan view of the chassis 100 of the present invention conforming to the ETSI standards. Chassis 100 is a, typically metal, frame that serves as the structural support for the electronic components of the telecom/datacom equipment. Preferably, ETSI chassis 100 is 650 mm high overall, 480 mm wide and 250 mm deep overall, which is a suitable form factor conforming to the ETSI standard. Chassis 100 comprises a lower, generally rectilinear, enclosure region 112 having slots 106 on a front wall partially defining enclosure region 112 for receiving and housing system modules (shown in FIG. 1b). Chassis 100 also comprises an upper, generally rectilinear, enclosure region 102 above enclosure 112 having slots 104 on a front wall partially defining enclosure region 102 for receiving and housing IMs (shown in FIG. 1b). Coextensive with the slots for receiving system modules along the edge of lower enclosure region are slots 108 for receiving and housing power modules (not shown). A slot 110 is located on the front side of chassis 100 below lower enclosure region 112 for receiving and housing an extractable fan tray module (shown in FIG. 1b) in a generally rectilinear fan enclosure region 122. The fan tray module provides the airflow for cooling the components housed within chassis 100.

The following represent preferred dimensions of the slots of chassis 100: both the slots receiving system modules 106 and IMs 104 are 6U in height and 20 mm (0.8") wide; slots receiving power modules 108 are 3U high and 40 mm wide, while the power modules are 100 mm high; slot receiving fan 110 is 2U in height and is substantially the width of chassis 100. For the sake of clarity, the preferred slot size is 6U and 6U is equal to 6*1.75=10.5" which is 266.7 mm. However, the size of the module itself is 233.35 mm because there are top and bottom rails, which decrease the size of the module. This is the case for the other modules of the system also. In the preferred embodiment, all cables are connected to the IMs on the upper side of the chassis, so as to not interfere with removal or insertion of a system card 106. The IMs have connectors on the front panel of them. The front panel is a metal plate in the size of 6U×0.8" (size of the slot) that is attached to the IM card printed circuit board (PCB). Each type of IM card may have different types of connectors. For example: D-type connectors, SCSI connectors, RJ-45 connectors, BNC (coax) connectors, etc. The connectors are usually soldered to the IM PCB and attached to the front panel. The exact position of the connector on the IM is dependent on various design factors, such as the number of connectors to be located on a given IM module.

Figure 1B:
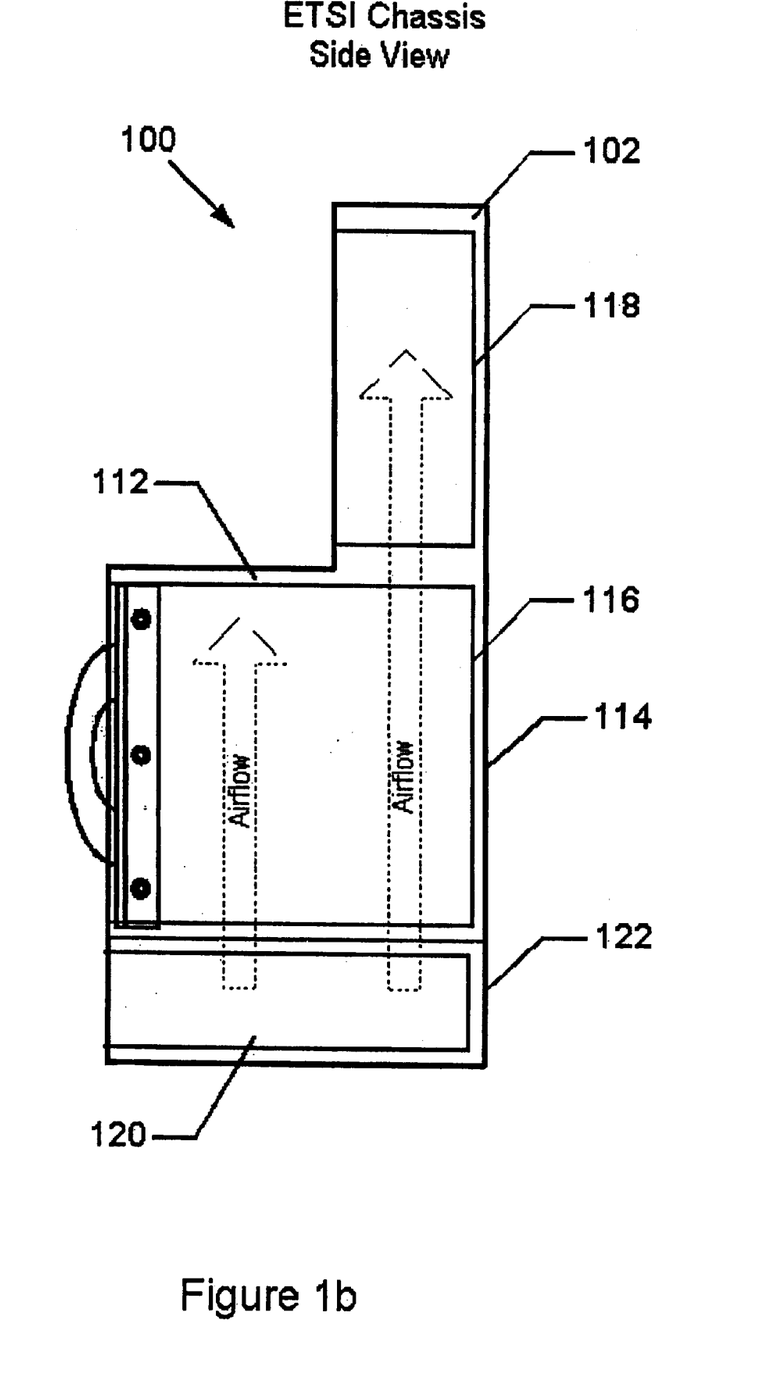
Figure 1C:
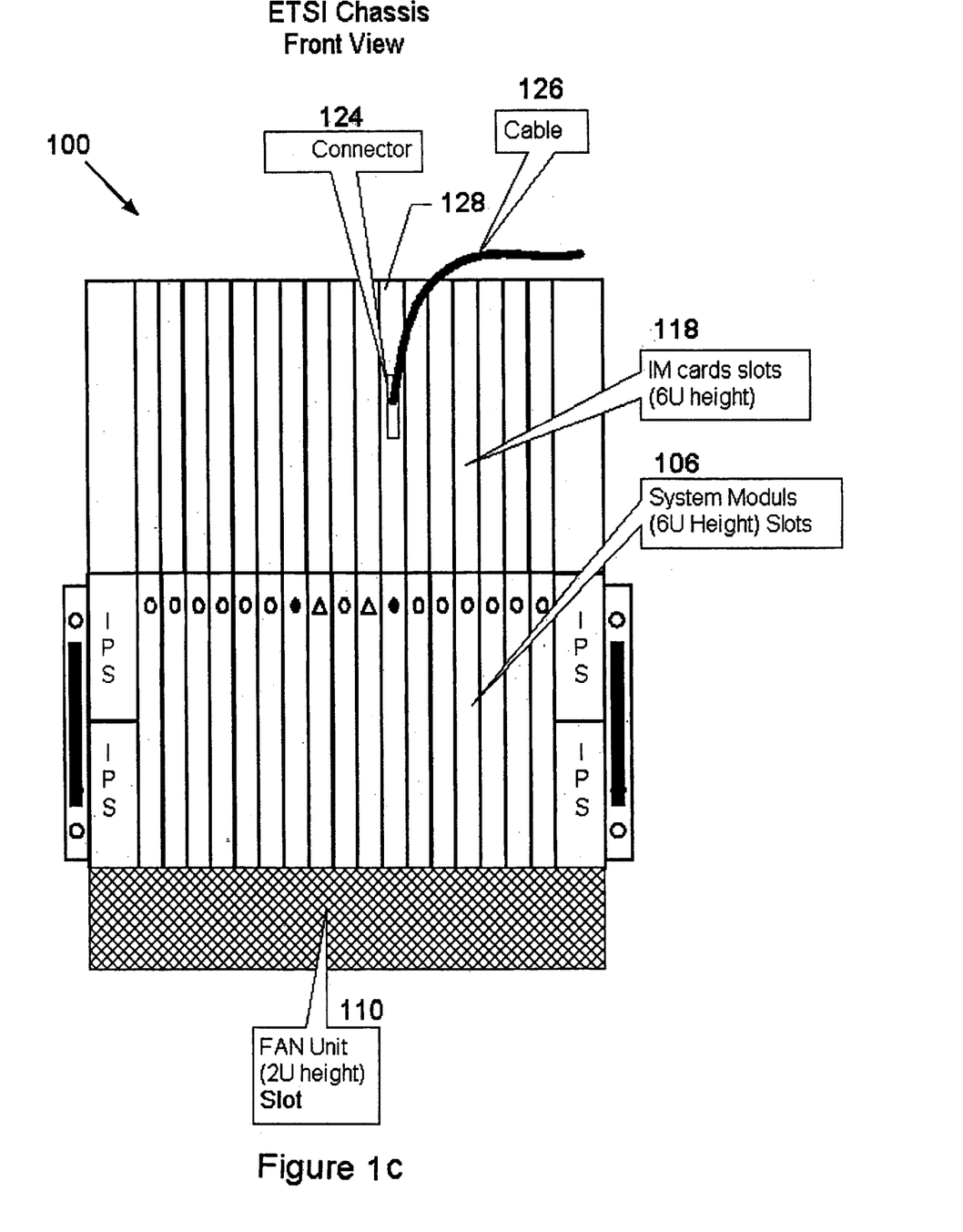
Figure 1D:
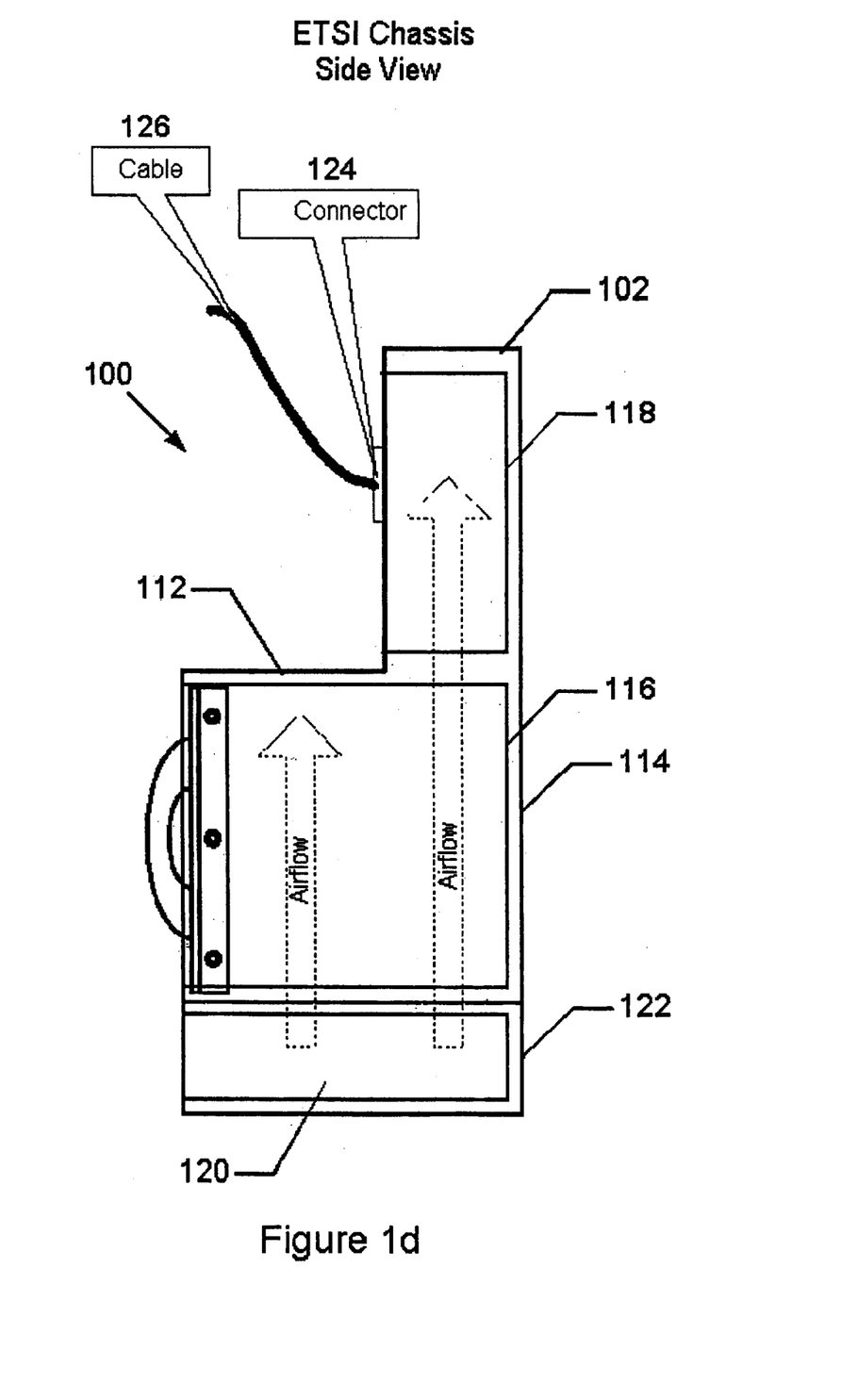

Shown in FIGS. 1c and 1d are front and side views, respectively, of chassis 100 having system modules and IMs 118 inserted with at least one cable connected to an IM 128. As shown an IM 128 of IMs 118 has a connector 124 to which a cable 126 is connected. As illustrated, all modular parts in the system (system modules, IMs, power supply modules, and fan tray) are accessed from the front side of chassis 100.

FIG. 1b shows a side cutaway view of chassis 100. Shown are IMs 118 received in upper enclosure 102, system modules 116 received in lower enclosure 112 and fan tray module 120 received in fan tray enclosure 122. Each of the modules extends substantially the depth of their respective enclosure regions and connects, via electrical connectors on their back edge, to a backplane (not shown), which extends along back wall 114 of chassis 100. The backplane has receiving electrical connectors, which the electrical connections of the modules are connected to when inserted as shown in FIG. 1b. The backplane provides for communication paths between the modules of the equipment. While not shown, power supply modules are additionally inserted into slots 108 and extend substantially the length of enclosure region 112 and connect to the backplane. Fan tray module 120 provides for airflow throughout the enclosures from the bottom of chassis 100 to the top of the chassis 100 as indicated by the arrows in FIG. 1b.

Figure 2A:
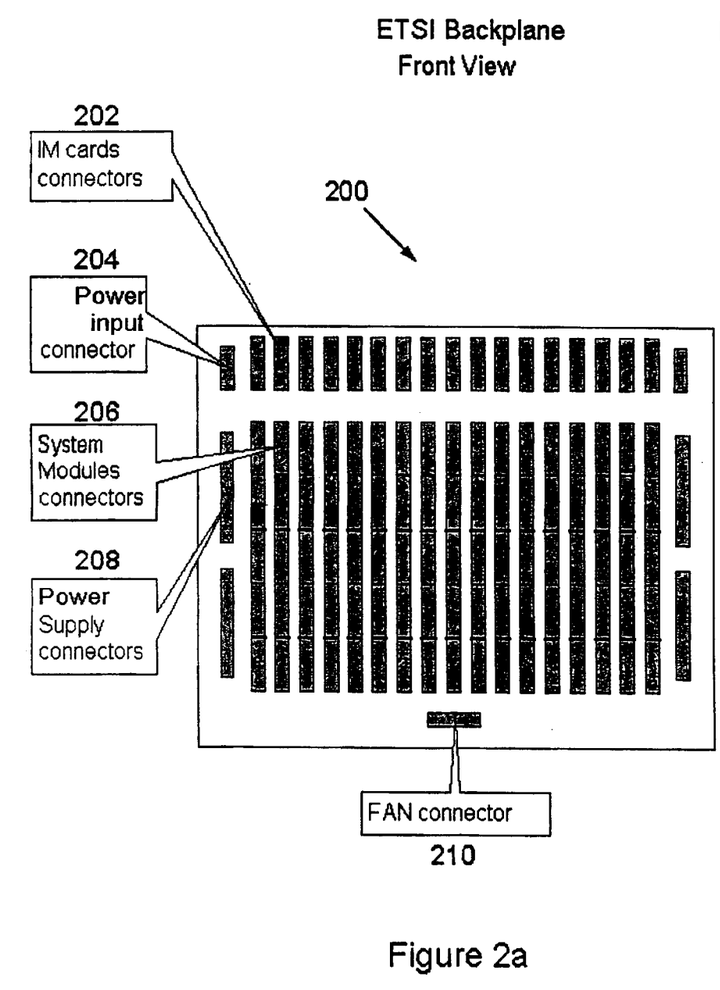
FIGS. 2a and 2b, collectively, illustrate the ETSI backplane of the present invention.
Figure 2B:
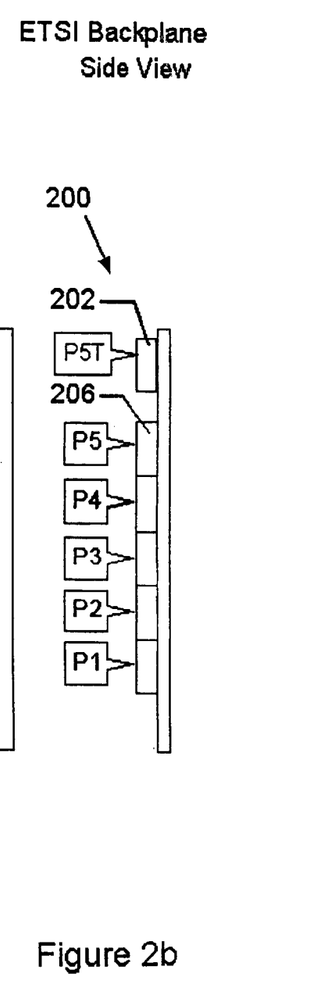

FIGS. 2a and 2b show front and side views, respectively, of ETSI backplane 200, which extends along back wall 114 of chassis 100. Backplane 200 combines, in one large board, the connectors for receiving the electrical connectors on the rear edge of the modules of the equipment. All of the connectors are located on the front side (component side) of backplane 200.

A set of connectors 202, for receiving the connectors of IMs 118, is disposed along an upper portion of backplane 200. As will be illustrated in conjunction with FIG. 5a, the top portion of backplane 200 with connectors 202 extends into upper enclosure region 102 from lower enclosure region 112, when backplane 200 is disposed along back wall 114 of chassis 100. In addition to connectors 202, power input connectors 204, power supply connectors 208, and fan connector 210 are disposed on backplane 200 in positions so as to receive the connectors of their respective modules when the modules are inserted into the slots of chassis 100.

A set of connectors 206, for receiving the connectors of system modules 116, is disposed along a lower portion of backplane 200. As will be illustrated in conjunction with FIG. 5, lower portion of backplane 200 is substantially contained within lower enclosure region 112 when backplane 200 is disposed along back wall 114 of chassis 100. Preferably, backplane 200 implements a cPCI bus. In addition, system modules 106 conform to 6U boards of the cPCI standard. As such, each connector of the set of connectors 206 is composed of 5 connectors P1–P5. Each one of the system modules 106 in the lower enclosure region 112 of chassis 100 is connected to the IM that is right above it in the upper enclosure region. The connection is made by wiring on backplane 200 between the connector P5 (FIG. 2b) of the corresponding connector for the system module and the connector P5T (FIG. 2b) for the IM above it.

Figure 3A:
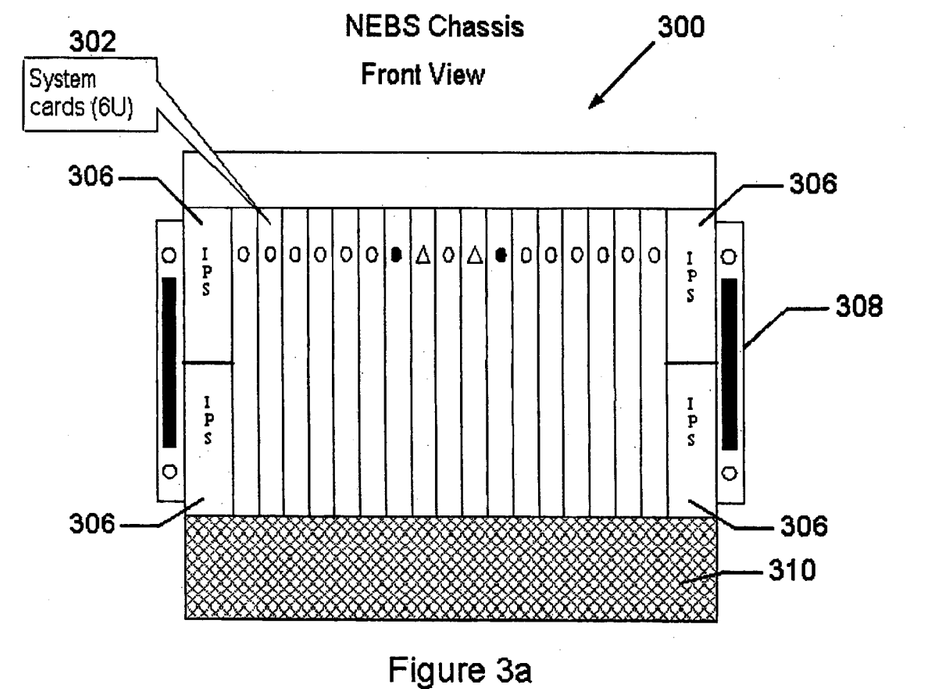
FIGS. 3a–3e, collectively, illustrate the NEBS chassis of the present invention.

As an alternative to ETSI compliant equipment, a chassis and backplane, capable of utilizing the same modules as those in the ETSI compliant equipment, is provided for compliance with the NEBS standard. FIG. 3a shows a plan view of a NEBS compliant chassis 300 capable of using the same modules as those used in the ETSI compliant equipment. Rather than an upper and lower enclosure region, chassis 300 has front 308 and rear 312, generally rectilinear, enclosure regions (shown in FIG. 3b). As with ETSI chassis 100, NEBS chassis 300 is a, typically, metal frame that serves as the structural support for the electronic components of the telecom/datacom equipment. Preferably, NEBS chassis 300 is 400 mm high overall (9U height—in USA the dimensions are usually given in U's or inches), 480 mm (19") wide and 350 mm (13.7") deep overall, which is a suitable form factor conforming to the NEBS standard.

Chassis 300 comprises slots 302 on a front wall partially defining enclosure 308 to receive and house system modules in the front enclosure region 308. Coextensive with the slots for receiving system modules, along the edges of the front of chassis 300 are slots 306 for receiving and housing power modules (not shown). A slot 310 is located on the front side of chassis below lower enclosure part for receiving and housing an extractable fan tray module in a generally rectilinear fan enclosure region. The fan tray module provides the airflow for cooling the components housed within chassis 300. As shown in FIG. 3c, slots 322 similar to slots 302 are provided on a rear wall of chassis 300 partially defining enclosure region 112 for receiving and housing IMs in rear enclosure region 312.

The preferred dimensions of the slots of chassis 300 are identical to that of ETSI chassis 100, i.e. both the slots receiving system modules 302 and IMs 322 are 6U in height and 20 mm wide; slots receiving power modules 306 are 3U high and 40 mm wide; slot receiving fan 310 is 2U in height and is substantially the width of chassis 100 wide.

Figure 3B:
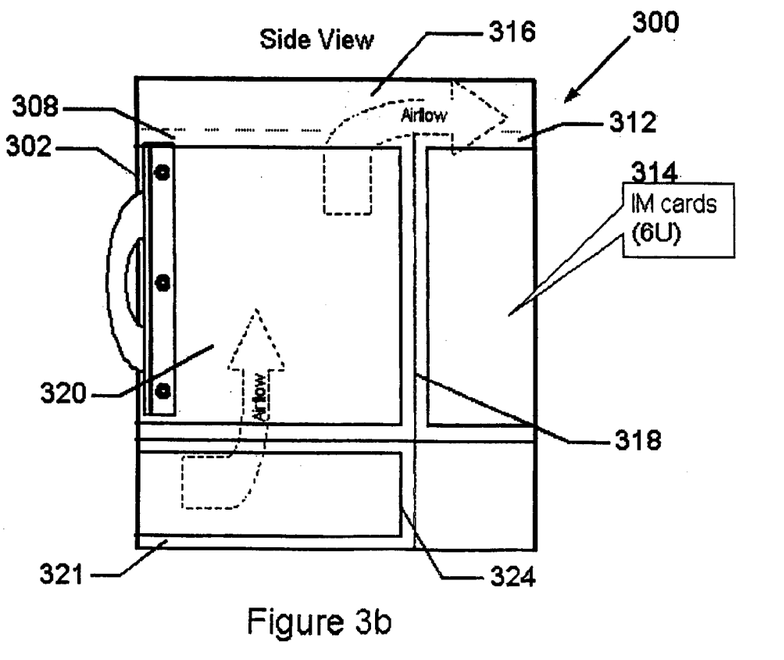
Figure 3C:
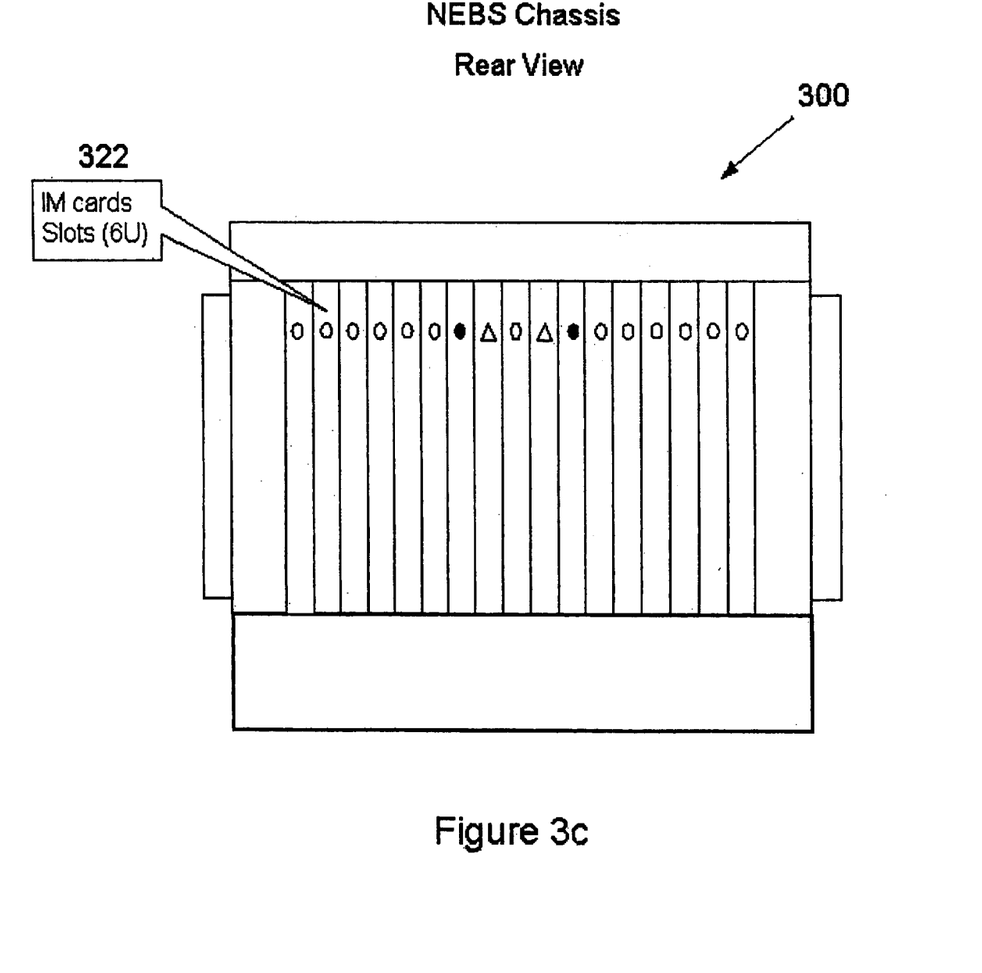

FIG. 3b shows a side cutaway view of chassis 300. Shown are IMs 314 received in rear enclosure 312, system modules 320 received in front enclosure 308 and fan tray module 324 received in fan tray enclosure 321. Each of the modules extends substantially the depth of their respective enclosure regions and connects, via electrical connectors on their back edge, to a backplane (not shown), which extends along the plane represented by dashed line 318 (further illustrated in FIG. 5). The backplane has receiving electrical connectors that the electrical connectors of the modules are connected to when inserted as shown in FIG. 3b. The backplane provides for communication paths between the modules of the equipment. While not shown, power supply modules are additionally inserted into slots 306 and extend substantially the length of enclosure region 308 and connect to the backplane. Air exhaust tunnel 316 extends along a top portion of chassis 300. Fan tray module 324 provides for airflow through front enclosure from the bottom of chassis 100 to the top of the chassis 100 and along exhaust tunnel 316. As such, the airflow direction is from the lower front side to the upper backside of the system as indicated by the arrows in FIG. 3b. The IM modules are cooled via convection.

Figure 3D:
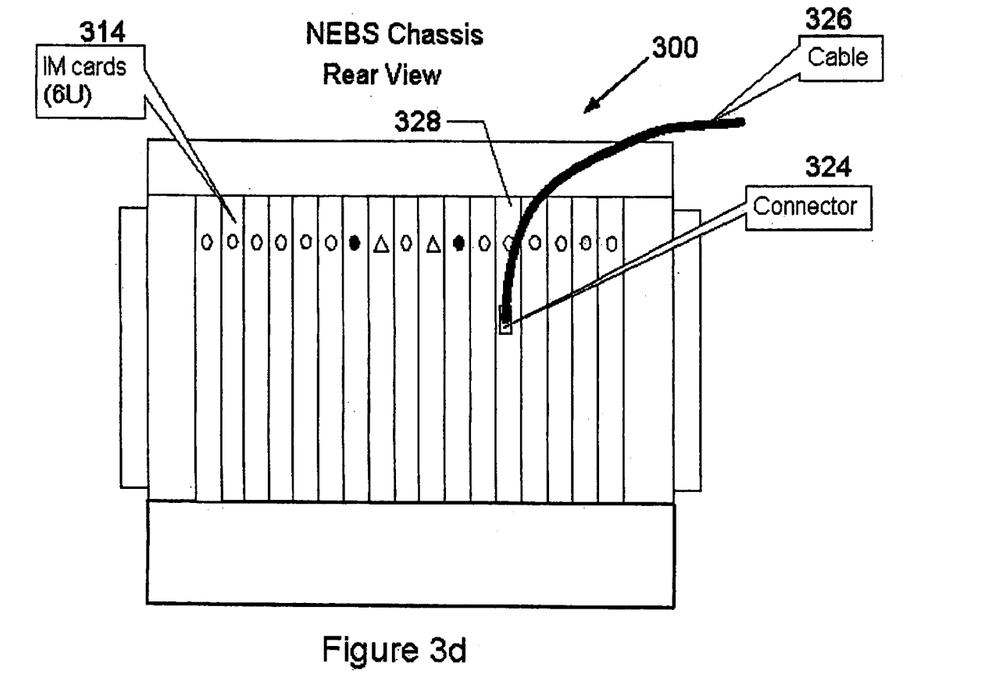
Figure 3E:
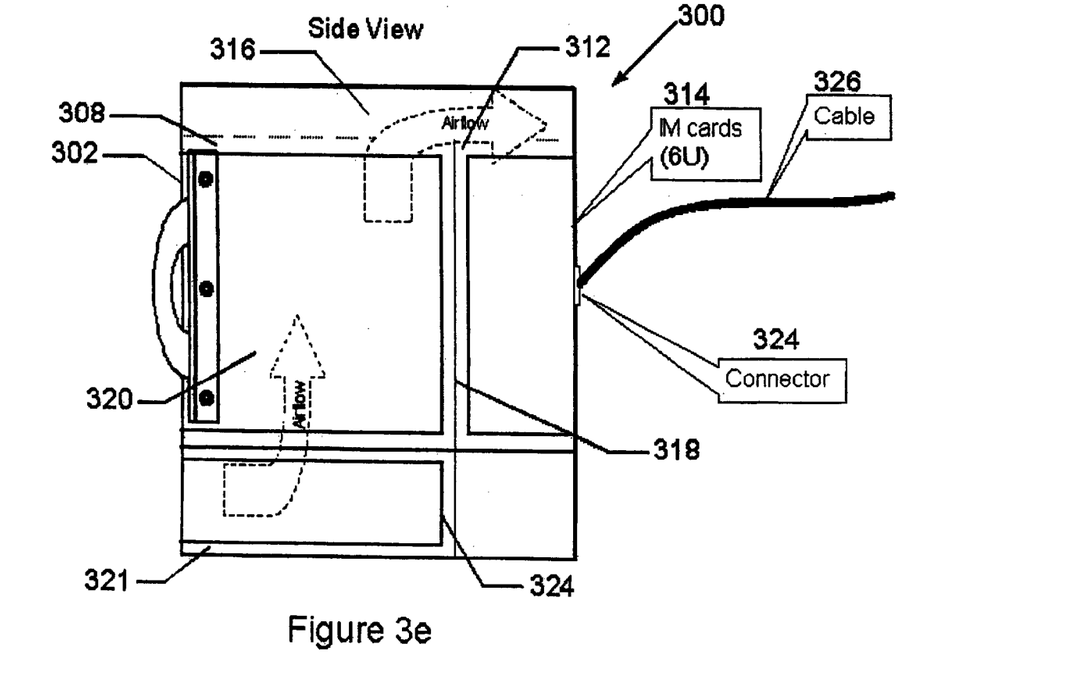

Shown in FIGS. 3d and 3e are front and side views, respectively, of chassis 300 having system modules and IMs 314 inserted with at least one cable connected to an IM 328. As shown an IM 328 of IMs 318 has a connector 324 to which a cable 326 is connected. As with ETSI chassis, IMs 314 have connectors on the front panel of them. The front panel is a metal plate in the size of 6U×0.8" (size of the slot) that is attached to the IM card printed circuit board (PCB). Each type of IM may have different types of connectors. For example: D-type connectors, SCSI connectors, RJ-45 connectors, BNC (coax) connectors, etc. The connectors are usually soldered to the IM PCB and attached to the front panel. The exact position of the connector on the IM is dependent on various design factors, such as the number of connectors to be located on a given IM module.

Figure 4A:
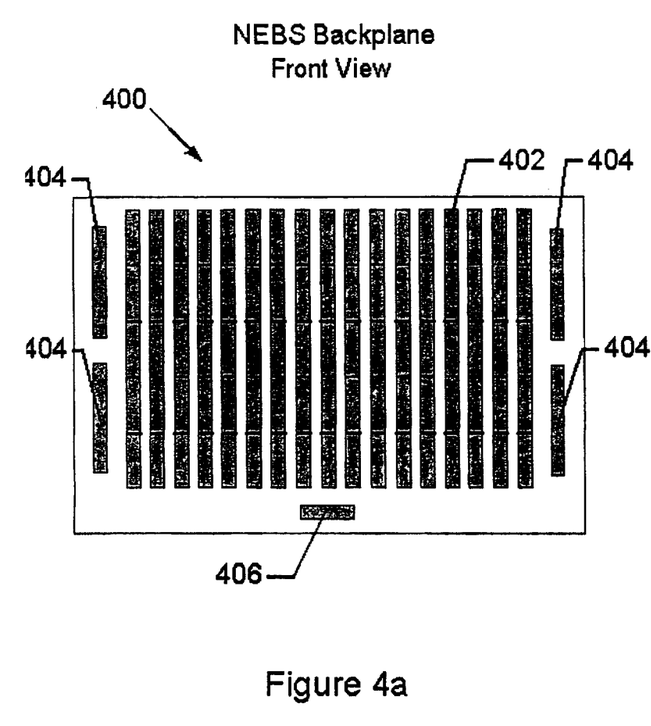
FIGS. 4a, 4b and 4c, collectively, illustrate the NEBS backplane of the present invention.
Figure 4B:
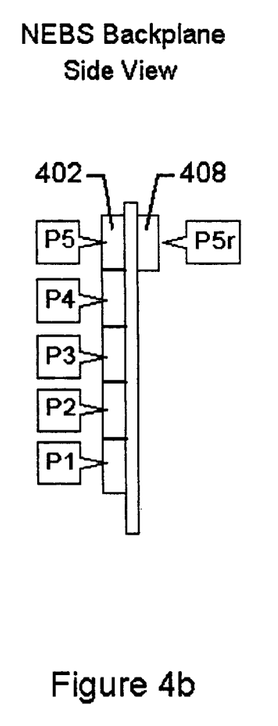
Figure 4C:
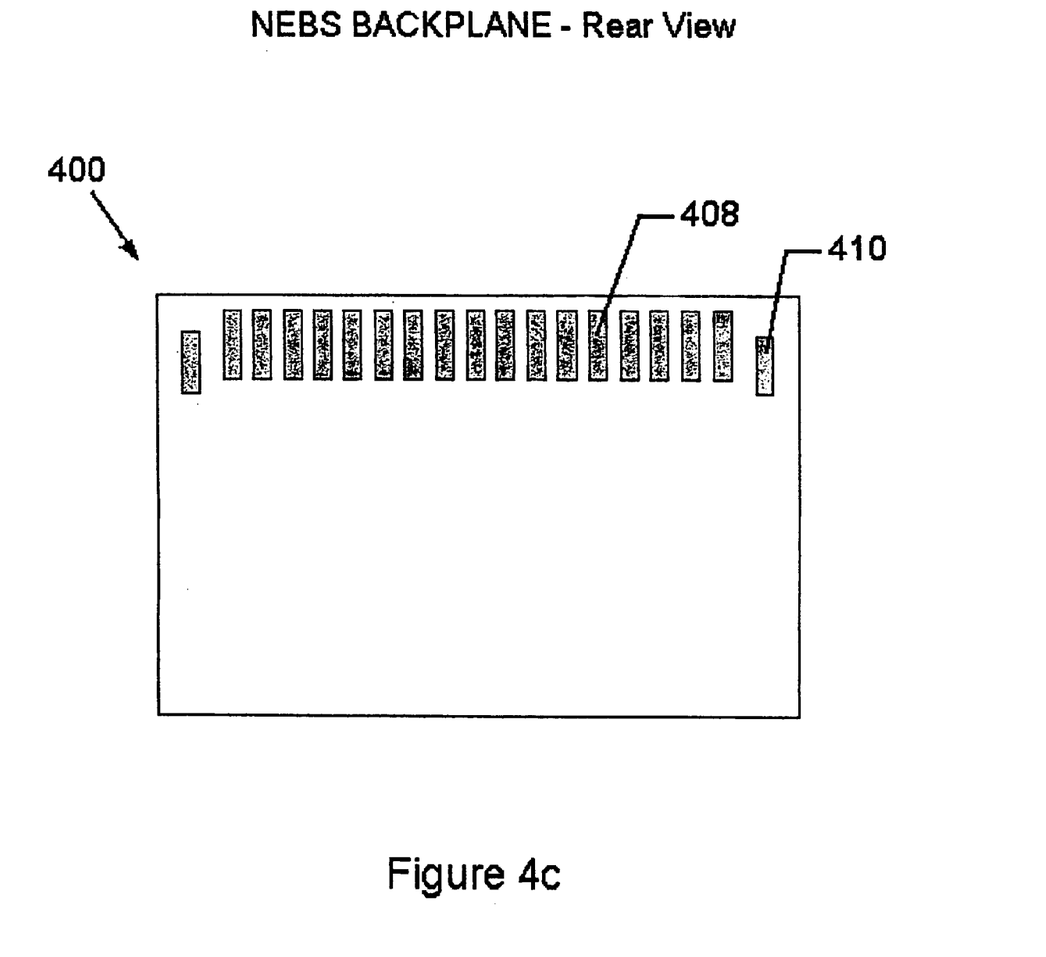

FIGS. 4a, 4b and 4c show front, side and rear views, respectively, of NEBS backplane 400, which extends along the plane represented by dashed line 318 (further illustrated in FIG. 5). Backplane 400 combines, in one large board, the connectors for receiving the electrical connections on the rear edge of the modules of the equipment.

A set of connectors 408, for receiving the connectors of IMs 314, are disposed along an upper portion of backplane 400 on the surface of backplane 400 facing rear enclosure region 312, in addition to power input connectors 410 (shown in FIGS. 4b and 4c). As shown in FIG. 4a, a set of connectors 402 is disposed centrally on the surface of backplane 400 facing front enclosure region 308 for receiving the connectors of system modules 320. In addition to connectors 402, power supply connectors 404 and fan connector 406 are disposed on the surface facing front enclosure region 308.

As with ETSI backplane 200, preferably, backplane 400 implements a cPCI bus. In addition, system modules 320 conform to 6U boards of the cPCI standard. As such, each connector of the set of connectors 402 is composed of 5 connectors P1–P5. Each one of system modules 320 in front enclosure region 308 of chassis 300 is connected to the IM that is right behind it in rear enclosure region 312. The connection is made through backplane 400 by the pins of each P5 connector extending through backplane 400 to the IM connector 408 immediately behind it P5r and acting as the electrical connection pins of both connectors.

Figure 5A:
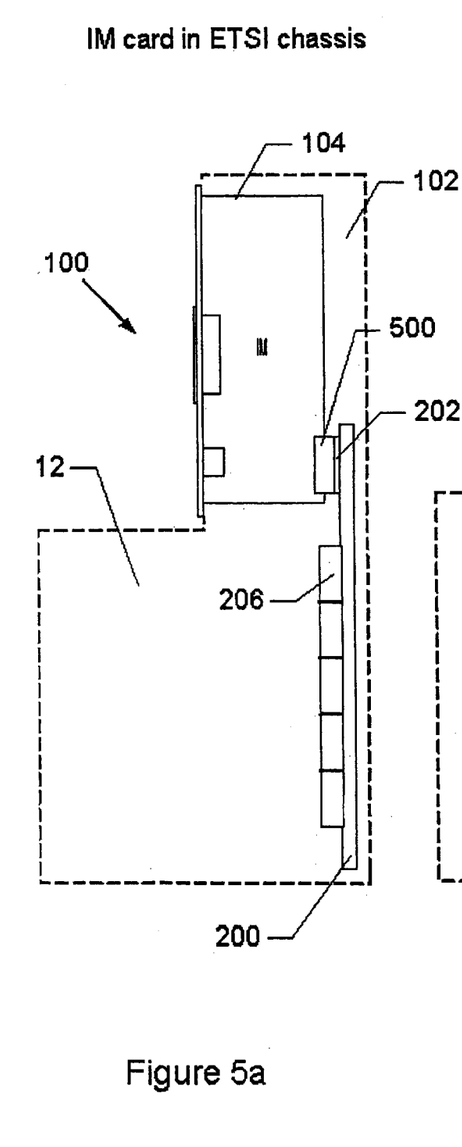
FIGS. 5a and 5b, respectively, illustrate an interface module inserted into an ETSI chassis with an ETSI backplane and an interface module inserted into an NEBS chassis with an NEBS backplane.

FIG. 5a illustrates IM 104 installed in ETSI chassis 100 and connected to ETSI backplane 200. As shown, the upper portion of backplane 200 with connectors 202 extends into upper enclosure region 102 from lower enclosure region 112 when backplane 200 is disposed along back wall 114 of chassis 100, while the bottom portion of backplane 200 with connectors 206 is substantially contained within lower enclosure region 112. IM 104 extends substantially the depth of upper enclosure region 102 and connects, via electrical connector 500 to connector 202 of backplane 200.

Figure 5B:
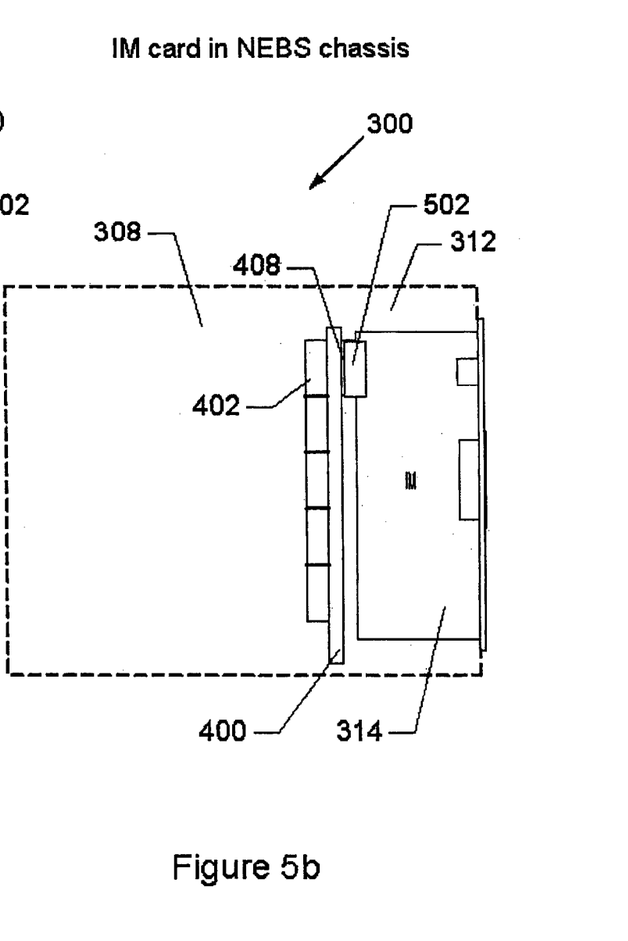

FIG. 5b illustrates IM 314 installed into NEBS chassis 300 and connected to NEBS backplane 400. As shown, backplane extends along the plane represented by dashed line 318. The surface of backplane 400 including connectors 402 faces front enclosure region 308, while the surface including connectors 408 faces rear enclosure 312. IM 314 extends substantially the depth of rear enclosure 312 and connects, via electrical connector 502 on the back edge, to connector 408, of backplane 400.

The above described chassis and backplanes allow a vendor of telecom/datacom equipment to vend equipment appropriate to the standards needed by a consumer of such equipment while substantially reducing the drawbacks discussed above. A vendor determines the standard needed by the consumer and when the consumer requires the ETSI standard, the vendor provides the ETSI compliant equipment. When the consumer requires the NEBS standard, the vendor provides the NEBS compliant equipment. Similarly, when vendors are assembling equipment for consumers, a determination is made as to what standard is required by the consumer. When it is determined the consumer requires equipment compliant with the ETSI standard, the vendor utilizes the ETSI chassis, disposes the ETSI backplane in the ETSI chassis as previously shown, and inserts the appropriate modules into their corresponding slots. Likewise, when it is determined the consumer requires equipment compliant with the NEBS standard, the vendor utilizes the NEBS chassis, disposes the NEBS backplane in the NEBS chassis as previously shown, and inserts the appropriate modules into their corresponding slots. The determination in either case is made by an indication given by the consumer of the standard required, by requesting the information from the consumer, or through previous records concerning the consumer or other a priori knowledge about the needs of the consumer.

The present invention allows telecom/datacom vendors to support all requirements with minimum engineering efforts and with minimum changes in the basic parts of the products. For the backplanes, most of the design is identical in both cases, the change between the two being related to connector P5. In the NEBS backplane, P5 connector has long pins extending through the backplane so the signals of P5 are transferred to the backside connector P5r (to the IM). On the ETSI backplane, P5 is connected to the upper connector P5T using wires on the backplane to transfer the signals. Hence, the NEBS backplane is a subset of the ETSI backplane. It can be produced simply by "cutting" the upper part of the ETSI backplane.

For both ETSI and NEBS equipment, the system modules, IMs, power supplies and fan modules are identical. An alternative to having all components completely identical is to have the PCB and electronics the same for IMs used in both, while reversing the writing on the mechanical panel for IMs of the alternate equipment, as, relative to the equipment the IM is installed in, if installed in the alternative equipment it would be inverted.

CONCLUSION

A system and method has been shown in the above embodiments for the effective implementation of ETSI/NEBS housing structures that provide support for all requirements with minimum engineering efforts. While various preferred embodiments have been shown and described, it will be understood that there is no intent to limit the invention by such disclosure, but rather, it is intended to cover all modifications and alternate constructions falling within the spirit and scope of the invention, as defined in the appended claims. For example, specific materials or bus standard should not limit the present invention.

What is claimed is:

1. A computer chassis for communication equipment conforming either to an ETSI standard or a NEBS standard in which subsystem components of said communication equipment are divided into one or more system modules implementing internal functions and one or more interface modules implementing input/output interfaces, said chassis comprising:

a first enclosure region at least partially defined by at least a first planar panel and a first plurality of side planar panels connected to edges of said first planar panel and extending substantially perpendicular to a plane defined by said first planar panel, said first enclosure region for housing said system modules received by slots on said first planar panel;

a second enclosure region at least partially defined by at least a second planar panel and a second plurality of side planar panels connected to edges of said second planar panel and extending substantially perpendicular to a plane defined by said second planar panel, said second enclosure region for housing said interface modules received by slots on said first planar panel;

a backplane including one or more connectors for receiving connectors of said system modules and connectors of said interface modules, and said first enclosure region, said second enclosure region and said backplane are placed in a first configuration for equipment conforming to said ETSI standard and said first enclosure region, said second enclosure region and said backplane are placed in a second configuration for equipment conforming to said NEBS standard.

2. A computer chassis for communication equipment conforming either to an ETSI standard or a NEBS standard in which subsystem components of said communication equipment are divided into one or more system modules implementing internal functions and one or more interface modules implementing input/output interfaces, as per claim 1, said chassis further comprising:

a fan enclosure region located beneath said first enclosure region at least partially defined by said first planar panel and one or more of said first plurality of side planar panels, said fan enclosure region for housing one or more fan modules and said backplane further including connectors for receiving connectors of said fan module.

3. A computer chassis for communication equipment conforming either to an ETSI standard or a NEBS standard in which subsystem components of said communication equipment are divided into one or more system modules implementing internal functions and one or more interface modules implementing input/output interfaces, as per claim 1, wherein in said first configuration, said connectors for receiving connectors of said system modules and connectors of said interface modules and said connectors for receiving connectors of said fan module located on a first surface of said backplane;

in said second configuration, said connectors for receiving system module connectors and said connectors for receiving connectors of said fan module are located on a first surface of said backplane and said connectors for receiving said interface module connectors are located on a second surface of said backplane opposite said first surface.

4. A computer chassis for communication equipment conforming either to an ETSI standard or a NEBS standard in which subsystem components of said communication equipment are divided into one or more system modules implementing internal functions and one or more interface modules implementing input/output interfaces, as per claim 1, wherein in said first configuration, said backplane connectors for receiving connectors of said system modules and connectors of said interface modules are located on a first surface of said backplane, and in said second configuration, said connectors for receiving system module connectors and said connectors for receiving said interface module connectors are located on opposite surfaces of said backplane.

5. A computer chassis for communication equipment conforming either to an ETSI standard or a NEBS standard in which subsystem components of said communication equipment are divided into one or more system modules implementing internal functions and one or more interface modules implementing input/output interfaces, as per claim 1, wherein in said first configuration, said connectors for receiving connectors of said system modules and connectors of said interface modules are located on said first surface of said backplane are connected via wiring on said backplane;

in said second configuration, at least one of said connectors for receiving system module connectors is connected to at least one of said connectors for receiving said interface module connectors via pins extending through said backplane.

6. A computer chassis for communication equipment conforming either to an ETSI standard or a NEBS standard in which subsystem components of said communication equipment are divided into one or more system modules implementing internal functions and one or more interface modules implementing input/output interfaces, as per claim 1, in both said first configuration and said second configuration, said backplane further including:

one or more connectors for receiving one or more connectors of a power supply module.

7. A computer chassis for communication equipment conforming either to an ETSI standard or a NEBS standard in which subsystem components of said communication equipment are divided into one or more system modules implementing internal functions and one or more interface modules implementing input/output interfaces, as per claim 5, wherein said connectors for receiving connectors of said system modules comprise a set of connectors, each connector of said set of connectors including five connectors aligned edge-to-edge.

8. Communication equipment conforming either to a ETSI or a NEBS standard in which subsystem components of said communication equipment are divided into system modules implementing internal functions and interface modules implementing input/output interfaces, said communication equipment comprising:

a first enclosure for housing one or more of said system modules, said first enclosure comprising access to one or more external connectors of said one or more system modules;

a second enclosure for housing one or more of said interface modules, said second enclosure comprising access to one or more external connectors of said one or more interface modules;

a backplane having a first and second side and including one or more first connectors for receiving said one or more external connectors of said system modules and one or more second connectors for receiving said one or more external connectors of said interface modules, and if said equipment conforms to said ETSI standards, said first and second enclosures are arranged in a first substantially vertical manner, said one or more first and second connectors disposed on said first side of said backplane with a connection of said one or more system module external connectors and one or more interface module external connectors to said one or more first and second connectors respectively, else if said equipment conforms to said NEBS standards, said first and second enclosures are arranged in a second substantially horizontal configuration, said one or more first and second connectors disposed on said first side and said second side of said backplane respectively with a connection of said one or more system module external connectors and said one or more interface module external connectors to said one or more first and second connector respectively.

9. Communication equipment conforming either to a ETSI or a NEBS standard in which subsystem components of said communication equipment are divided into system modules implementing internal functions and interface modules implementing input/output interfaces, as per claim 8, said equipment further comprising:
 a fan enclosure region located beneath said first enclosure, said fan enclosure region for housing one or more fan modules and said backplane further including one or more connectors for receiving one or more external connectors of said fan module.

10. Communication equipment conforming either to a ETSI or a NEBS standard in which subsystem components of said communication equipment are divided into system modules implementing internal functions and interface modules implementing input/output interfaces, as per claim 9, if said equipment conforms to said NEBS standard, said chassis further comprising:
 an air exhaust tunnel located above said first enclosure region.

11. Communication equipment conforming either to a ETSI or a NEBS standard in which subsystem components of said communication equipment are divided into system modules implementing internal functions and interface modules implementing input/output interfaces, as per claim 8, said backplane further including one or more connectors for receiving one or more external connectors of one or more power supply modules.

12. Communication equipment conforming either to a ETSI or a NEBS standard in which subsystem components of said communication equipment are divided into system modules implementing internal functions and interface modules implementing input/output interfaces, as per claim 8, wherein said one or more first connectors for receiving one or more external connectors of said one or more system modules comprise plural connectors, each connector of said plural connectors including five connectors aligned edge-to-edge.

13. Communication equipment conforming either to a ETSI or a NEBS standard in which subsystem components of said communication equipment are divided into system modules implementing internal functions and interface modules implementing input/output interfaces, as per claim 8, wherein
 if said chassis conforms to said ETSI standards, said one or more first connectors and one or more second connectors are connected via wiring on said backplane;
 in said second configuration, at least one of said one or more first connectors is connected to at least one of said one or more second connectors via pins extending through said backplane.

14. Communication equipment chassis designed so as to be produced conforming to multiple standards, said standards including at least an ETSI standard and a NEBS standard, said chassis comprising:
 a first enclosure region defined by at least a first planar panel and a first plurality of side planar panels connected to edges of said first planar panel and extending substantially perpendicular to a plane defined by said first planar panel, said first enclosure region for housing system modules received by slots on said first planar panel;
 a second enclosure region defined by at least a second planar panel and a second plurality of side planar panels connected to edges of said second planar panel and extending substantially perpendicular to a plane defined by said second planar panel, said second enclosure region for housing interface modules received by slots on said first planar panel;
 a backplane disposed in said first enclosure region substantially parallel to said first planar panel at a distance from said first panel substantially equal to the length of said system modules, said backplane including a first set of connectors substantially contained within said first enclosure region on a surface of said backplane facing said first planar panel;
 if conforming to said ETSI standard, said first enclosure region contiguous to said second enclosure region along a plane substantially perpendicular to both said first planar panel and said second planar panel, said backplane extends from said first enclosure region into said second enclosure region, said backplane including a second set of connectors substantially contained within said second enclosure region on a surface of said backplane facing said second planar panel, else
 if conforming to said NEBS standard, said first enclosure region contiguous to said second enclosure region along a plane substantially parallel to both said first planar panel and said second planar panel which coincides with a plane defined by said backplane, said backplane including a second set of connectors substantially contained within said second enclosure region on a surface of said backplane facing said second planar panel.

15. Communication equipment chassis designed so as to be produced conforming to multiple standards, said standards including at least an ETSI standard and a NEBS standard, as per claim 14, said chassis further comprising:
 a fan enclosure region located beneath said first enclosure region at least partially defined by said first planar panel and one or more of said first plurality of side planar panels, said fan enclosure region for housing one or more fan modules and said backplane further including one or more connectors for receiving one or more connectors of said fan module.

16. Communication equipment chassis designed so as to be produced conforming to multiple standards, said standards including at least an ETSI standard and a NEBS standard, as per claim 14, said backplane further including:
 one or more connectors for receiving one or more connectors of a power supply module.

17. Communication equipment chassis designed so as to be produced conforming to multiple standards, said standards including at least an ETSI standard and a NEBS standard, as per claim 14, wherein
 if conforming to said ETSI standard, said first set of connectors and said second set of connectors are connected via wiring on said backplane;
 if conforming to said NEBS standard, at least one of said first set of connectors is connected to at least one of said second set of connectors via pins extending through said backplane.

18. Communication equipment chassis designed so as to be produced conforming to multiple standards, said standards including at least an ETSI standard and a NEBS standard, as per claim 14, wherein each connector of said first set of connectors includes five connectors aligned edge-to-edge.

19. Communication equipment chassis designed so as to be produced conforming to multiple standards, said standards including at least an ETSI standard and a NEBS standard, as per claim 14, if conforming to said NEBS standard, said chassis further comprise:

an air exhaust tunnel located above said first enclosure region.

20. A method of assembling telecom/datacom equipment to meet a standard required by a consumer of said telecom/datacom equipment, said method comprising:

determining whether said consumer requires said telecom/datacom equipment to meet a NEBS standard or a ETSI standard;

providing a chassis compliant with said ETSI standard for a determination of ETSI, said chassis comprising:

a first front planar panel partially defining a lower enclosure region including one or more system module slots located thereon for receiving system modules of said alternative telecom/datacom equipment, said lower enclosure region for housing said system modules received through said system module slots;

a second front planar panel located above said first front planar panel partially defining a upper enclosure region located above said lower enclosure region, said second front planar panel including one or more interface module slots located thereon for receiving interface modules of said alternative telecom/datacom equipment, said upper enclosure region for housing said interface modules received through said interface module slots;

a common back planar panel partially defining both of said upper enclosure region and said lower enclosure region;

a plurality of side planar panels extending between said front panels and said common back planar panel further defining said upper and lower enclosure regions;

disposing a backplane along said common back planar panel, said backplane comprising:

an upper portion including one or more electrical connectors for receiving electrical connectors of said interface modules;

a lower portion including one or more electrical connectors for receiving electrical connectors of said system modules, and said lower portion contained substantially within said lower enclosure region and said upper portion is contained substantially within said upper enclosure region;

inserting at least one interface module into said one or more interface module slots such that said electrical connectors of said interface modules are received by said electrical connectors included in said upper portion of said backplane;

inserting at least one system module into said one or more system module slots such that said electrical connectors of said system modules is received by said electrical connectors included in said lower portion of said backplane;

alternately providing a chassis compliant with said NEBS standard for a determination of NEBS, said chassis comprising:

a front planar panel partially defining a front enclosure region including one or more system module slots located thereon for receiving system modules of said alternative telecom/datacom equipment, said front enclosure region for housing said system modules received through said system module slots;

a rear planar panel located behind said front planar panel partially defining a rear enclosure region located behind said front enclosure region, said rear planar panel including one or more interface module slots located thereon for receiving interface modules of said alternative telecom/datacom equipment, said rear enclosure region for housing said interface modules received through said interface module slots;

said front enclosure region and said rear enclosure region divided by a plane perpendicular to the normals of said front and rear planar panels;

a plurality of side planar panels extending between said front panel and said rear planar panel further defining said front and rear enclosure regions;

disposing a backplane along said plane perpendicular to the normals of said front and rear planar panels, said backplane comprising:

a first surface facing said front planar panel including one or more electrical connectors for receiving electrical connectors of said interface modules, and a second surface opposite said first surface including one or more electrical connectors for receiving electrical connectors of said system modules;

inserting at least one interface module into said one or more interface module slots such that said electrical connectors of said interface modules are received by said electrical connectors included on said first surface of said backplane, and inserting at least one system module into said one or more system module slots such that said electrical connectors of said system modules is received by said electrical connectors included on said second surface of said backplane.

21. A method of vending telecom/datacom equipment to a consumer of said telecom equipment, said method comprising:

determining whether said consumer requires said telecom/datacom equipment to meet a NEBS standard or a ETSI standard;

providing ETSI compliant telecom/datacom equipment to said consumer for a determination of ETSI, said ETSI compliant equipment comprising:

a first front planar panel partially defining a lower enclosure region including one or more system module slots located thereon for receiving system modules of said alternative telecom/datacom equipment, said lower enclosure region for housing said system modules received through said system module slots;

a second front planar panel located above said first front planar panel partially defining a upper enclosure region located above said lower enclosure region, said second front planar panel including one or more interface module slots located thereon for receiving interface modules of said alternative telecom/datacom equipment, said upper enclosure region for housing said interface modules received through said interface module slots;

a common back planar panel partially defining both of said upper enclosure region and said lower enclosure region;

a plurality of side planar panels extending between said front panels and said common back planar panel further defining said upper and lower enclosure regions;

a backplane disposed along said common back planar panel, said backplane comprising:
    an upper portion including one or more electrical connectors for receiving electrical connectors of said interface modules;
    a lower portion including one or more electrical connectors for receiving electrical connectors of said system modules, and
    said lower portion contained substantially within said lower enclosure region and said upper portion is contained substantially within said upper enclosure region;
alternately providing NEBS compliant telecom/datacom equipment to said consumer for a determination of NEBS, said NEBS compliant equipment comprising:
    a front planar panel partially defining a front enclosure region including one or more system module slots located thereon for receiving system modules of said alternative telecom/datacom equipment, said front enclosure region for housing said system modules received through said system module slots;
    a rear planar panel located behind said front planar panel partially defining a rear enclosure region located behind said front enclosure region, said rear planar panel including one or more interface module slots located thereon for receiving interface modules of said alternative telecom/datacom equipment, said rear enclosure region for housing said interface modules received through said interface module slots;
    said front enclosure region and said rear enclosure region divided by a plane perpendicular to the normals of said front and rear planar panels;
    a plurality of side planar panels extending between said front panel and said rear planar panel further defining said front and rear enclosure regions;
    a backplane disposed along said plane perpendicular to the normals of said front and rear planar panels, said backplane comprising:
        a first surface facing said front planar panel including one or more electrical connectors for receiving electrical connectors of said interface modules, and
        a second surface opposite said first surface including one or more electrical connectors for receiving electrical connectors of said system modules.

* * * * *